United States Patent
Shin et al.

(10) Patent No.: US 8,416,037 B2
(45) Date of Patent: Apr. 9, 2013

(54) PHASE SHIFTER USING BULK ACOUSTIC WAVE RESONATOR

(75) Inventors: Jea Shik Shin, Hwaseong-si (KR); Dal Ahn, Asan-si (KR); Duck Hwan Kim, Goyang-si (KR); In Sang Song, Yongin-si (KR); Chul Soo Kim, Hwaseong-si (KR); Yun Kwon Park, Dongducheon-si (KR); Hyung Rak Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 364 days.

(21) Appl. No.: 12/834,130

(22) Filed: Jul. 12, 2010

(65) Prior Publication Data

US 2011/0102099 A1 May 5, 2011

(30) Foreign Application Priority Data

Sep. 7, 2009 (KR) ........................ 10-2009-0083818

(51) Int. Cl.
*H03H 9/66* (2006.01)
*H03H 9/00* (2006.01)

(52) U.S. Cl.
USPC ............................................ 333/141; 333/189

(58) Field of Classification Search .................. 333/133, 333/141, 187, 188, 189, 190, 191, 192
See application file for complete search history.

(56) References Cited

U.S. PATENT DOCUMENTS

| | | | |
|---|---|---|---|
| 5,714,917 A | 2/1998 | Ella | |
| 5,939,918 A | 8/1999 | McGarry et al. | |
| 6,509,812 B2 | 1/2003 | Sayyah | |
| 7,106,148 B2 * | 9/2006 | Kawamura | 333/133 |
| 2004/0227578 A1 | 11/2004 | Hamalainen | |
| 2008/0246566 A1 | 10/2008 | Oh | |

FOREIGN PATENT DOCUMENTS

WO  WO 2004/102808  11/2004

\* cited by examiner

*Primary Examiner* — Dean O Takaoka
(74) *Attorney, Agent, or Firm* — NSIP Law

(57) ABSTRACT

A phase shifter using a Bulk Acoustic Wave Resonators (BAWR) is provided. The phase shifter using a BAWR may use a property of a phase shift with respect to a frequency of the BAWR, and also use at least one capacitor, at least one inductor, and the like.

13 Claims, 10 Drawing Sheets

PHASE SHIFTER USING BULK ACOUSTIC WAVE RESONATOR

CROSS-REFERENCE TO RELATED APPLICATION(S)

This application claims the benefit under 35 U.S.C. §119 (a) of Korean Patent Application No. 10-2009-0083818, filed Sep. 7, 2009, in the Korean Intellectual Property Office, the entire disclosure of which is incorporated herein by reference for all purposes.

BACKGROUND

1. Field

The following description relates to a phase shifter, and in more particular, a phase shifter using at least one of a Bulk Acoustic Wave Resonator (BAWR), an inductor, and a capacitor.

2. Description of the Related Art

A communication device may use a signal processing apparatus, capable of shifting a phase of an inputted signal and generating a time delay, such as a phase shifter. A phase shifter may be used in a variety of radio frequency application fields.

In a conventional art, a phase shifter may be embodied using an inductor and a capacitor. However, energy loss may be significant, a size of phase shifter may increase, and circuit integration may not be performed.

Accordingly, a phase shifter that may be compact, suitable for circuit integration, and reduce a loss of coil may be desired to reduce a size of a communication device and improve efficiency.

SUMMARY

In one general aspect, there is provided a phase shifter. The phase shifter includes at least one Bulk Acoustic Wave Resonator (BAWR), at least one capacitor configured to be connected to the at least one BAWR, and a plurality of ports configured to be connected to the at least one BAWR and the at least one capacitor.

The at least one BAWR may include a first BAWR and a second BAWR, the plurality of ports may include a first port and a second port, the at least one capacitor may include a first capacitor, a first connector of the first BAWR, the first port, and a first connector of the first capacitor may be connected, a first connector of the second BAWR, the second port, and a second connector of the first capacitor may be connected, and a second connector of the first BAWR and a second connector of the second BAWR may be connected to ground.

Also, the at least one BAWR may include a first BAWR and a second BAWR, the plurality of ports may include a first port and a second port, the at least one capacitor may include a first capacitor, a first connector of the first BAWR may be connected to the first port, a first connector of the second BAWR may be connected to the second port, a second connector of the first BAWR and a second connector of the second BAWR may be connected to a first connector of the first capacitor, and a second connector of the first capacitor may be connected to ground.

The at least one BAWR may include a first BAWR, the plurality of ports may include a first port and a second port, the at least one capacitor may include a first capacitor and a second capacitor, a first connector of the first capacitor, the first port, and a first connector of the first BAWR may be connected, a first connector of the second capacitor, the second port, and a second connector of the first BAWR may be connected, and a second connector of the first capacitor and a second connector of the second capacitor may be connected to ground.

The at least one BAWR may include a first BAWR, the plurality of ports may include a first port and a second port, the at least one capacitor may include a first capacitor and a second capacitor, a first connector of the first capacitor may be connected to the first port, a first connector of the second capacitor may be connected to the second port, a second connector of the first capacitor and a second connector of the second capacitor may be connected to a first connector of the first BAWR, and a second connector of the first BAWR may be connected to ground.

In another general aspect, there is provided a phase shifter which includes at least one BAWR, at least one inductor configured to be connected to the at least one BAWR, and a plurality of ports configured to be connected to the at least one BAWR and the at least one inductor.

The at least one BAWR may include a first BAWR and a second BAWR, the plurality of ports may include a first port and a second port, the at least one inductor may include a first inductor, a first connector of the first BAWR, the first port, and a first connector of the first inductor may be connected, a first connector of the second BAWR, the second port, and a second connector of the first inductor may be connected, and a second connector of the first BAWR and a second connector of the second BAWR may be connected to ground.

Also, the at least one BAWR may include a first BAWR and a second BAWR, the plurality of ports may include a first port and a second port, the at least one inductor may include a first inductor, a first connector of the first BAWR may be connected to the first port, a first connector of the second BAWR may be connected to the second port, a second connector of the first BAWR and a second connector of the second BAWR may be connected to a first connector of the first inductor, and a second connector of the first inductor may be connected to ground.

The at least one BAWR may include a first BAWR, the plurality of ports may include a first port and a second port, the at least one inductor may include a first inductor and a second inductor, a first connector of the first inductor, the first port, and a first connector of the first BAWR may be connected, a first connector of the second inductor, the second port, and a second connector of the first BAWR may be connected, and a second connector of the first inductor and a second connector of the second inductor may be connected to ground.

Also, the at least one BAWR may include a first BAWR, the plurality of ports may include a first port and a second port, the at least one inductor may include a first inductor and a second inductor, a first connector of the first inductor may be connected to the first port; a first connector of the second inductor may be connected to the second port, a second connector of the first inductor and a second connector of the second inductor may be connected to a first connector of the first BAWR, and a second connector of the first BAWR may be connected to ground.

In still another general aspect, there is provided a phase shifter which includes three BAWRs including a first BAWR, a second BAWR, and a third BAWR and a plurality of ports to be connected to the three BAWRs.

A first connector of the first BAWR and a first connector of the second BAWR may be connected to a first port of the plurality of ports, a second connector of the first BAWR and a second connector of the third BAWR may be connected to a second port of the plurality of ports, a second connector of the second BAWR and a first connector of the third BAWR may be connected to ground.

Also, a first connector of the first BAWR may be connected to a first port of the plurality of ports, a first connector of the second BAWR may be connected to a second port of the plurality of ports, a second connector of the first BAWR and a second connector of the second BAWR may be connected to a first connector of the third BAWR, and a second connector of the third BAWR may be connected to ground.

Other features and aspects may be apparent from the following detailed description, the drawings, and the claims.

Figure 1:
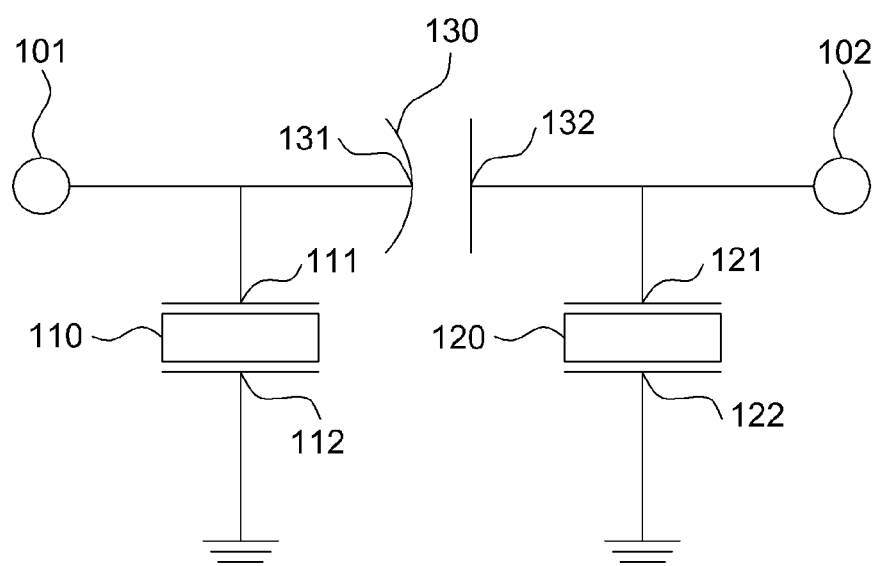
FIG. 1 is a diagram illustrating a configuration of an example of a phase shifter including two Bulk Acoustic Wave Resonators (BAWRs), a single capacitor, and two ports.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. The progression of processing steps and/or operations described is an example; however, the sequence of steps and/or operations is not limited to that set forth herein and may be changed as is known in the art, with the exception of steps and/or operations necessarily occurring in a certain order. Also, descriptions of well-known functions and constructions may be omitted for increased clarity and conciseness.

According to one example of an embodiment, a phase shifter including at least one of a Bulk Acoustic Wave Resonator (BAWR), a capacitor, and an inductor may include at least one BAWR, at least one capacitor to be connected to the at least one BAWR, and a plurality of ports to be connected to the at least one BAWR and the at least one capacitor.

Also, a phase shifter including at least one of a BAWR, a capacitor, and an inductor may include at least one BAWR, at least one inductor to be connected to the at least one BAWR, and a plurality of ports to be connected to the at least one BAWR and the at least one inductor.

Also, a phase shifter including at least one of a BAWR, a capacitor, and an inductor may include three BAWRs, and a plurality of ports to be connected to the three BAWRs. Examples of embodiments of a phase shifter including at least one of a BAWR, a capacitor, and an inductor are described below.

FIG. 1 illustrates a configuration of an example of a phase shifter including two BAWRs, a single capacitor, and two ports.

This example of a phase shifter includes a first BAWR 110, a second BAWR 120, a first port 101, a second port 102, and a first capacitor 130.

A first connector 111 of the first BAWR 110, the first port 101, and a first connector 131 of the first capacitor 130 may be connected. A first connector 121 of the second BAWR 120, the second port 102, and a second connector 132 of the first capacitor 130 may be connected. Also, a second connector 112 of the first BAWR 110 and a second connector 122 of the second BAWR 120 may be connected to ground. That is, the two BAWRs 110 and 120, where each single connector is connected to ground, may be connected to the two ports 101 and 102 and the single capacitor 130.

In this instance, a BAWR may be smaller than an inductor, and the like, reduce energy loss, and be suitable for circuit integration. Accordingly, when the BAWR is used for the phase shifter, the phase shifter may be more compact and suitable for circuit integration.

Figure 2:
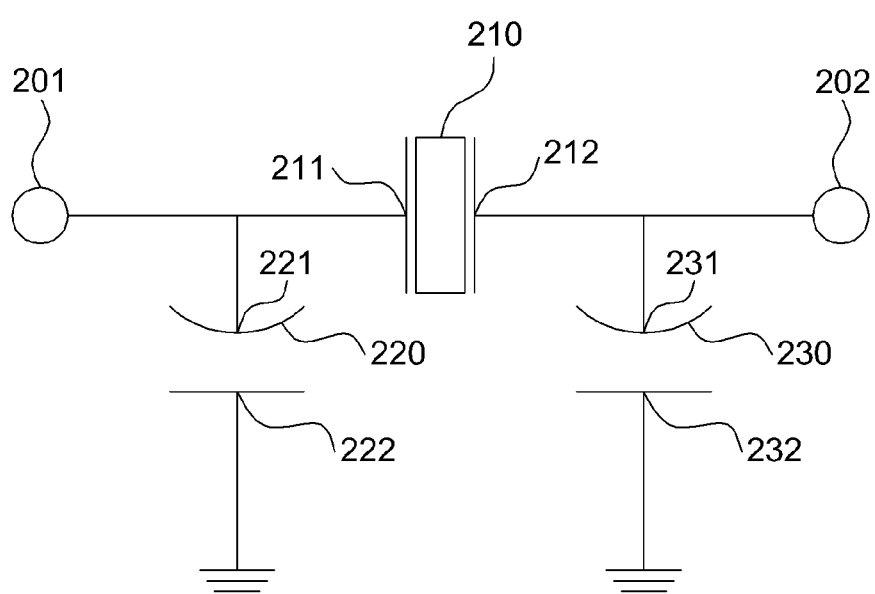
FIG. 2 is a diagram illustrating a configuration of an example of a phase shifter including a single BAWR, two capacitors, and two ports.

FIG. 2 illustrates a configuration of an example of a phase shifter including a single BAWR, two capacitors, and two ports.

This example of a phase shifter includes a first BAWR 210, a first port 201, a second port 202, a first capacitor 220, and a second capacitor 230.

A first connector 221 of the first capacitor 220, the first port 201, and a first connector 211 of the first BAWR 210 may be connected. A first connector 231 of the second capacitor 230, the second port 202, and a second connector 212 of the first BAWR 210 may be connected. Also, a second connector 222 of the first capacitor 220 and a second connector 232 of the second capacitor 230 may be connected to ground. That is, the two capacitors 220 and 230, where each single connector is connected to ground, may be connected to the two ports 201 and 202 and the single BAWR 210.

Figure 3:
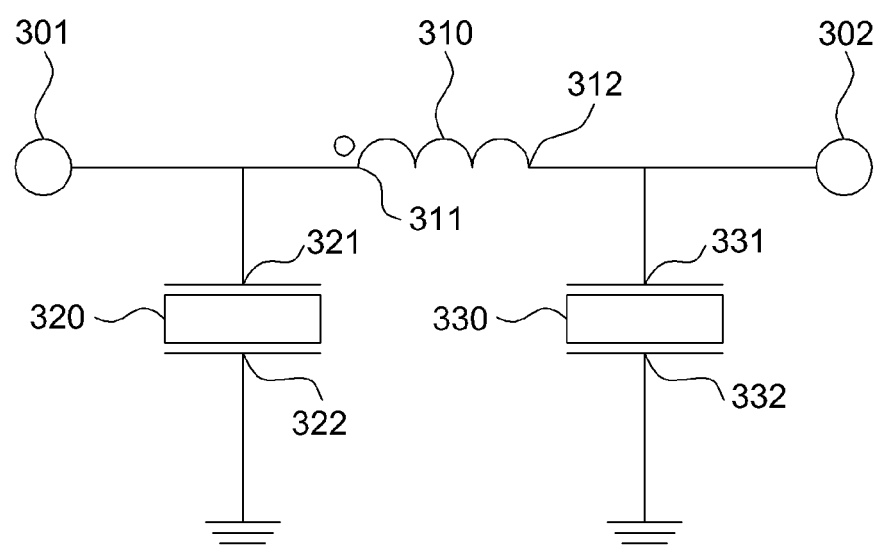
FIG. 3 is a diagram illustrating a configuration of an example of a phase shifter including two BAWRs, a single inductor, and two ports.

FIG. 3 illustrates a configuration of an example of a phase shifter including two BAWRs, a single inductor, and two ports.

This example of a phase shifter includes a first BAWR 320, a second BAWR 330, a first port 301, a second port 302, and a first inductor 310.

A first connector 321 of the first BAWR 320, the first port 301, and a first connector 311 of the first inductor 310 may be connected. A first connector 331 of the second BAWR 330, the second port 302, and a second connector 312 of the first inductor 310 may be connected. Also, a second connector 322 of the first BAWR 320 and a second connector 332 of the second BAWR 330 may be connected to ground. That is, the inductor 310 may be substituted for the capacitor 130 of FIG. 1. The two BAWRs 320 and 330, where each single connector is connected to ground, may be connected to the two ports 301 and 302 and the single inductor 310.

Figure 4:
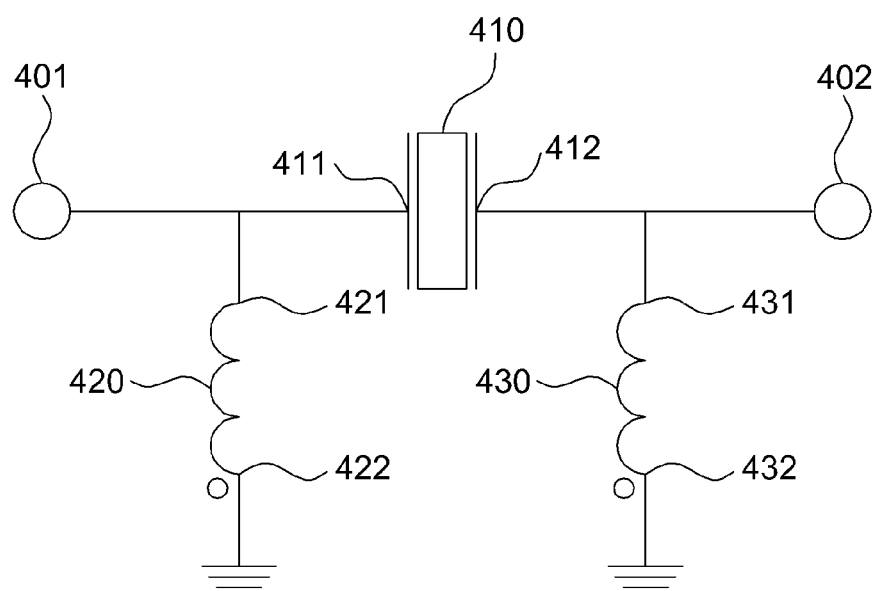
FIG. 4 is a diagram illustrating a configuration of an example of a phase shifter including a single BAWR, two inductors, and two ports.

FIG. 4 illustrates a configuration of an example of a phase shifter including a single BAWR, two inductors, and two ports.

This example of a phase shifter includes a first BAWR 410, a first port 401, a second port 402, a first inductor 420, and a second inductor 430.

A first connector 421 of the first inductor 420, the first port 401, and a first connector 411 of the first BAWR 410 may be connected. A first connector 431 of the second inductor 430, the second port 402, and a second connector 412 of the first BAWR 410 may be connected. Also, a second connector 422 of the first inductor 420 and a second connector 432 of the second inductor 430 may be connected to ground. That is, the inductors 420 and 430 may be substituted for the capacitors 220 and 230 of FIG. 2. The two inductors 420 and 430, where each single connector is connected to ground, may be connected to the two ports 401 and 402 and the single BAWR 410.

Figure 5:
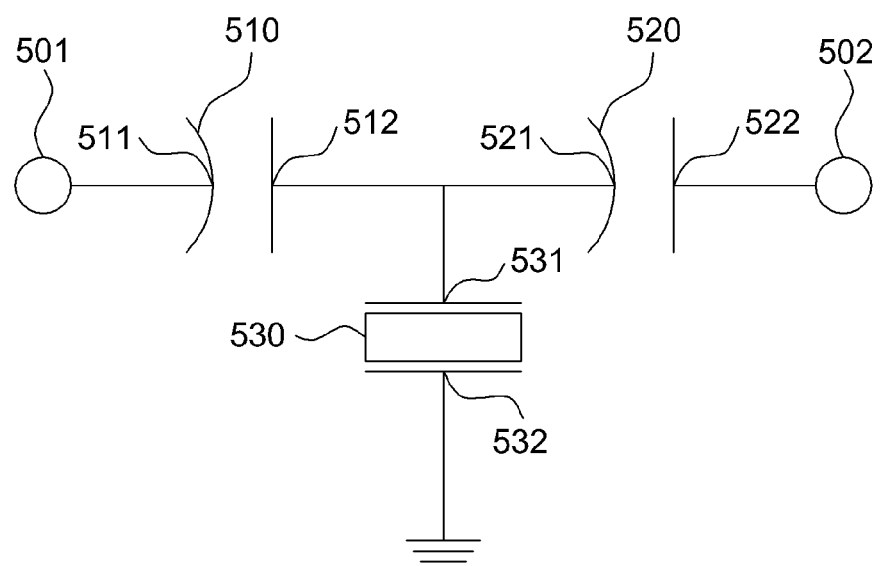
FIG. 5 is a diagram illustrating a configuration of another example of a phase shifter including a single BAWR, two capacitors, and two ports.

FIG. 5 illustrates a configuration of another example of a phase shifter including a single BAWR, two capacitors, and two ports.

Here, the example of a phase shifter includes a first BAWR 530, a first port 501, a second port 502, a first capacitor 510, and a second capacitor 520.

A first connector 511 of the first capacitor 510 may be connected to the first port 501, and a first connector 522 of the second capacitor 520 may be connected to the second port 502. Also, a second connector 512 of the first capacitor 510 and a second connector 521 of the second capacitor 520 may be connected to a first connector 531 of the first BAWR 530. A second connector 532 of the first BAWR 530 may be connected to ground. That is, the two capacitors 510 and 520, where each single connector is connected to a single port, may be connected to the BAWR 530, where a single connector is connected to ground.

Figure 6:
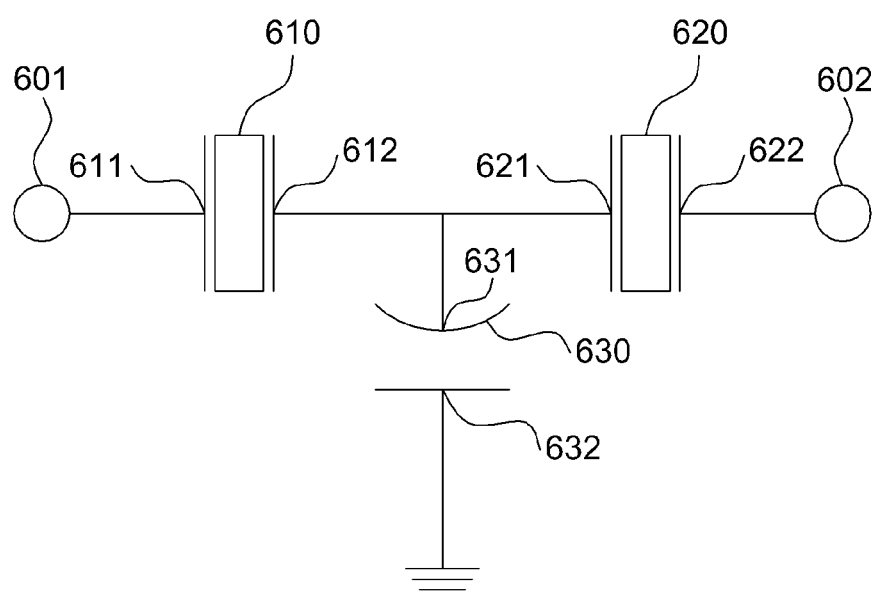
FIG. 6 is a diagram illustrating a configuration of another example of a phase shifter including two BAWRs, a single capacitor, and two ports.

FIG. 6 illustrates a configuration of another example of a phase shifter including two BAWRs, a single capacitor, and two ports.

This example of a phase shifter includes a first BAWR 610, a second BAWR 620, a first port 601, a second port 602, and a first capacitor 630.

A first connector 611 of the first BAWR 610 may be connected to the first port 601, and a first connector 622 of the second BAWR 620 may be connected to the second port 602. Also, a second connector 612 of the first BAWR 610 and a second connector 621 of the second BAWR 620 may be connected to a first connector 631 of the first capacitor 630. A second connector 632 of the first capacitor 630 may be connected to ground. That is, the two BAWRs 610 and 620, where each single connector is connected to a single port, may be connected to the capacitor 630, where a single connector is connected to ground.

Figure 7:
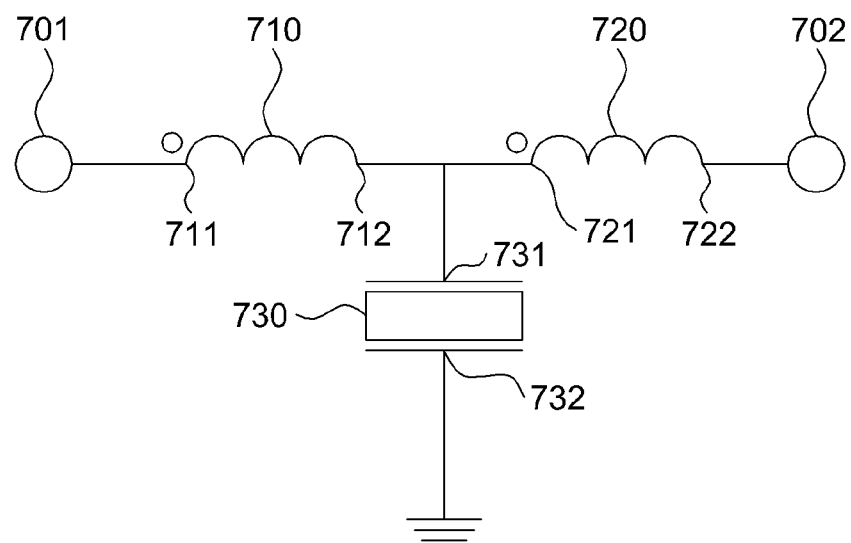
FIG. 7 is a diagram illustrating a configuration of another example of a phase shifter including a single BAWR, two inductors, and two ports.

FIG. 7 illustrates a configuration of another example of a phase shifter including a single BAWR, two inductors, and two ports.

In this example, the phase shifter includes a first BAWR 730, a first port 701, a second port 702, a first inductor 710, and a second inductor 720.

A first connector 711 of the first inductor 710 may be connected to the first port 701, and a first connector 722 of the second inductor 720 may be connected to the second port 702. Also, a second connector 712 of the first inductor 710 and a second connector 722 of the second inductor 720 may be connected to a first connector 731 of the first BAWR 730. A second connector 732 of the first BAWR 730 may be connected to ground. That is, the inductors 710 and 720 may be substituted for the capacitors 510 and 520 of FIG. 5. The two inductors 710 and 720, where each single connector is connected to a single port, may be connected to the BAWR 730, where a single connector is connected to ground.

Figure 8:
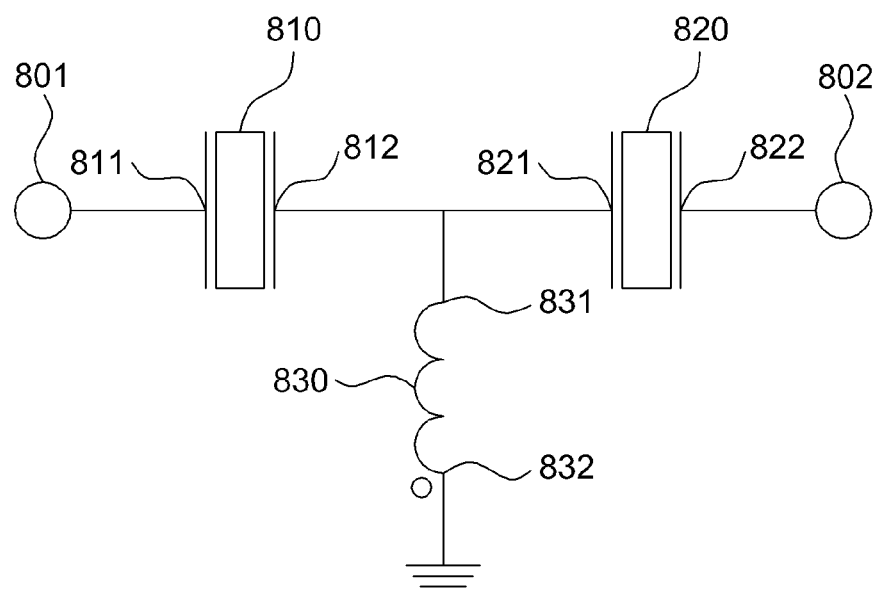
FIG. 8 is a diagram illustrating a configuration of another example of a phase shifter including two BAWRs, a single inductor, and two ports.

FIG. 8 illustrates a configuration of another example of a phase shifter including two BAWRs, a single inductor, and two ports.

Referring to FIG. 8, this example of a phase shifter includes a first BAWR 810, a second BAWR 820, a first port 801, a second port 802, and a first inductor 830.

A first connector 811 of the first BAWR 810 may be connected to the first port 801, and a first connector 822 of the second BAWR 820 may be connected to the second port 802. Also, a second connector 812 of the first BAWR 810 and a second connector 821 of the second BAWR 820 may be connected to a first connector 831 of the first inductor 830. A second connector 832 of the first inductor 830 may be connected to ground. That is, the inductor 830 may be substituted for the capacitor 630 of FIG. 6. The two BAWRs 810 and 820, where each single connector is connected to a single port, may be connected to the inductor 830, where a single connector is connected to ground.

Figure 9:
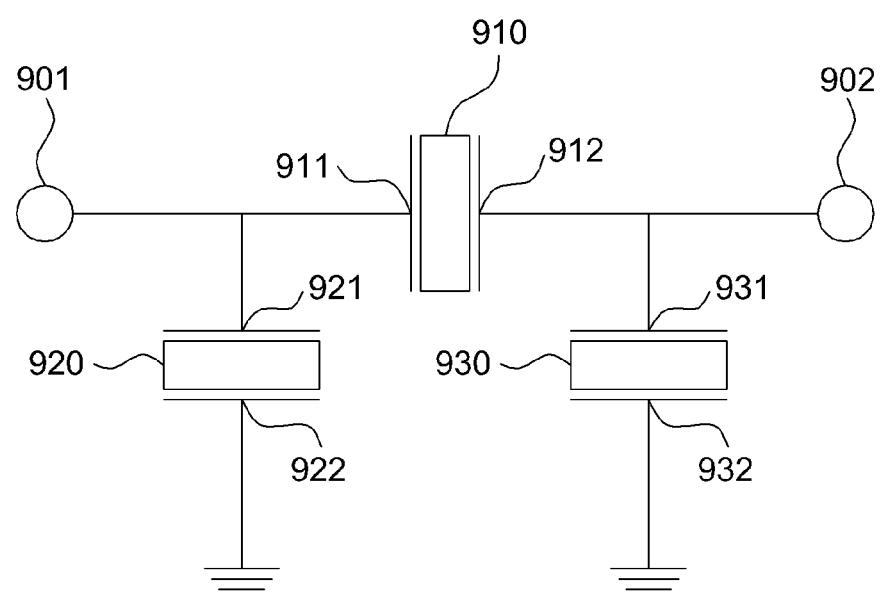
FIG. 9 is a diagram illustrating a configuration of an example of a phase shifter including three BAWRs.

FIG. 9 illustrates a configuration of an example of a phase shifter including three BAWRs.

Here, the phase shifter includes a first BAWR 910, a second BAWR 920, a third BAWR 930, a first port 901, and a second port 902.

A first connector 911 of the first BAWR 910 and a first connector 921 of the second BAWR 920 may be connected to the first port 901. A second connector 912 of the first BAWR 910 and a second connector 931 of the third BAWR 930 may be connected to the second port 902. Also, a second connector 922 of the second BAWR 920 and a first connector 932 of the third BAWR 930 may be connected to ground. That is, the two BAWRs 920 and 930, where each single connector is connected to ground, may be connected to the two ports 901 and 902 and the other BAWR 910.

As described above, the examples of a phase shifter may include only a plurality of BAWRs, and thus an energy loss may be reduced, a size of the phase shifter may be reduced, and circuit integration may be more easily performed.

Figure 10:
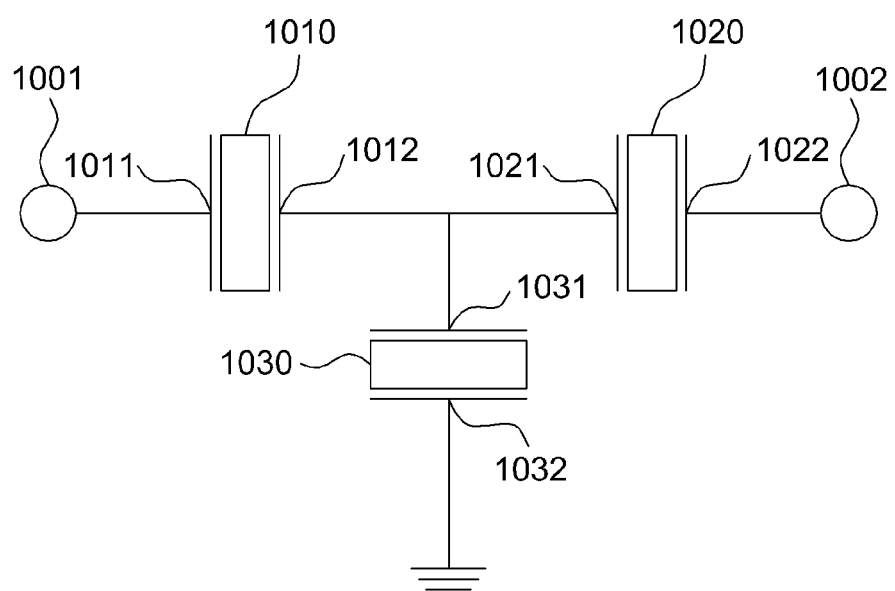
FIG. 10 is a diagram illustrating a configuration of another example of a phase shifter including three BAWRs.

FIG. 10 illustrates a configuration of another example of a phase shifter including three BAWRs.

Here, the phase shifter includes a first BAWR 1010, a second BAWR 1020, a third BAWR 1030, a first port 1001, and a second port 1002.

A first connector 1011 of the first BAWR 1010 may be connected to the first port 1001. A first connector 1022 of the second BAWR 1020 may be connected to the second port 1002. Also, a second connector 1012 of the first BAWR 1010 and a second connector 1021 of the second BAWR 1020 may be connected to a first connector 1031 of the third BAWR 1030. A second connector 1032 of the third BAWR 1030 may be connected to ground. That is, the two BAWRs 1010 and 1020, where each single connector is connected to a single port, may be connected to the other BAWR 1030, where a single connector is connected to ground.

As described above, a phase shifter may include only BAWRs, or a BAWR and at least one of a capacitor and an inductor, and thereby reduce an energy loss and be more compact. Also, a phase shifter using a BAWR may be more suitable for circuit integration.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A phase shifter comprising:
at least one bulk acoustic wave resonator (BAWR);
at least one capacitor configured to be connected to the at least one BAWR;
a first port configured to be directly connected to one of the at least one BAWR and to one of the at least one capacitor; and
a second port configured to be directly connected to one of the at least one BAWR and to one of the at least one capacitor.

2. A phase shifter comprising:
a first bulk acoustic wave resonator (BAWR) and a second BAWR;
a capacitor; and
a first port and a second port, wherein
a first connector of the first BAWR, the first port, and a first connector of the capacitor are connected,
a first connector of the second BAWR, the second port, and a second connector of the capacitor are connected, and
a second connector of the first BAWR and a second connector of the second BAWR are connected to ground.

3. A phase shifter comprising:
a first bulk acoustic wave resonator (BAWR) and a second BAWR;
a capacitor; and
a first port and a second port, wherein
a first connector of the first BAWR is connected to the first port,
a first connector of the second BAWR is connected to the second port,
a second connector of the first BAWR and a second connector of the second BAWR are connected to a first connector of the capacitor, and
a second connector of the capacitor is connected to ground.

4. A phase shifter comprising:
a bulk acoustic wave resonator (BAWR);
a first capacitor and a second capacitor; and
a first port and a second port, wherein
a first connector of the first capacitor, the first port, and a first connector of the BAWR are connected,
a first connector of the second capacitor, the second port, and a second connector of the BAWR are connected, and
a second connector of the first capacitor and a second connector of the second capacitor are connected to ground.

5. A phase shifter comprising:
a bulk acoustic wave resonator (BAWR);
a first capacitor and a second capacitor; and
a first port and a second port, wherein
a first connector of the first capacitor is connected to the first port,
a first connector of the second capacitor is connected to the second port,
a second connector of the first capacitor and a second connector of the second capacitor are connected to a first connector of the BAWR, and
a second connector of the BAWR is connected to ground.

6. A phase shifter comprising:
at least one bulk acoustic wave resonator (BAWR);
at least one inductor configured to be connected to the at least one BAWR;
a first port configured to be directly connected to one of the at least one BAWR and to one of the at least one inductor; and
a second port configured to be directly connected to one of the at least one BAWR and to one of the at least one inductor.

7. A phase shifter comprising:
a first bulk acoustic wave resonator (BAWR) and a second BAWR;
an inductor; and
a first port and a second port, wherein
a first connector of the first BAWR, the first port, and a first connector of the inductor are connected,
a first connector of the second BAWR, the second port, and a second connector of the inductor are connected, and
a second connector of the first BAWR and a second connector of the second BAWR are connected to ground.

8. A phase shifter comprising:
a first bulk acoustic wave resonator (BAWR) and a second BAWR;
an inductor; and
a first port and a second port, wherein
a first connector of the first BAWR is connected to the first port,
a first connector of the second BAWR is connected to the second port,
a second connector of the first BAWR and a second connector of the second BAWR are connected to a first connector of the inductor, and
a second connector of the inductor is connected to ground.

9. A phase shifter comprising:
a bulk acoustic wave resonator (BAWR);
a first inductor and a second inductor; and
a first port and a second port, wherein
a first connector of the first inductor, the first port, and a first connector of the BAWR are connected,
a first connector of the second inductor, the second port, and a second connector of the BAWR are connected, and
a second connector of the first inductor and a second connector of the second inductor are connected to ground.

10. A phase shifter comprising:
a bulk acoustic wave resonator (BAWR);
a first inductor and a second inductor; and
a first port and a second port, wherein
a first connector of the first inductor is connected to the first port,
a first connector of the second inductor is connected to the second port,
a second connector of the first inductor and a second connector of the second inductor are connected to a first connector of the BAWR, and
a second connector of the BAWR is connected to ground.

11. A phase shifter comprising:
three bulk acoustic wave resonators (BAWRs) comprising a first bulk acoustic wave resonator (BAWR), a second BAWR, and a third BAWR that are directly connected to each other;
a first port configured to be directly connected to at least one of the three BAWRs; and
a second port configured to be directly connected to at least one of the three BAWRs.

12. The phase shifter of claim 11, wherein:
a first connector of the first BAWR and a first connector of the second BAWR are directly connected to the first port;
a second connector of the first BAWR and a second connector of the third BAWR are directly connected to the second port; and a second connector of the second BAWR and a first connector of the third BAWR are connected to ground.

13. The phase shifter of claim 11, wherein:
a first connector of the first BAWR is directly connected to the first port;
a first connector of the second BAWR is directly connected to the second port;
a second connector of the first BAWR and a second connector of the second BAWR are connected to a first connector of the third BAWR; and
a second connector of the third BAWR is connected to ground.

\* \* \* \* \*